US012804864B2

(12) United States Patent
Jones

(10) Patent No.: US 12,804,864 B2
(45) Date of Patent: Nov. 17, 2026

(54) FLEXIBLE DISPLAYS WITH HEATING ELEMENTS

(71) Applicant: Apple Inc., Cupertino, CA (US)

(72) Inventor: Christopher D Jones, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 155 days.

(21) Appl. No.: 18/672,740

(22) Filed: May 23, 2024

(65) Prior Publication Data

US 2025/0365904 A1 Nov. 27, 2025

(51) Int. Cl.
*H05K 5/02* (2006.01)
*H05K 7/20* (2006.01)

(52) U.S. Cl.
CPC ....... *H05K 7/20954* (2013.01); *H05K 5/0226* (2013.01)

(58) Field of Classification Search
CPC ....... H05K 5/0017; H05K 5/0217; H05K 5/03
USPC ......................................... 361/807, 809, 810
See application file for complete search history.

(56) References Cited

U.S. PATENT DOCUMENTS 7,782,274 B2 8/2010 Manning
9,829,924 B2 11/2017 Shin et al.
10,067,528 B2 9/2018 Lee et al.
11,245,782 B2 2/2022 Hong
2005/0142317 A1 6/2005 Clovesko et al.
2017/0064879 A1* 3/2017 Lee .......................... G06F 1/16
2017/0139511 A1* 5/2017 Ohsawa .................. G06F 3/045
2017/0325343 A1* 11/2017 Seo ....................... G06F 1/1652
2019/0069451 A1 2/2019 Myers et al.
2021/0109619 A1* 4/2021 Kim ...................... G06F 3/0412
2024/0079442 A1* 3/2024 Nguyen ................ G06F 1/1652

* cited by examiner

*Primary Examiner* — Hung S. Bui

(74) *Attorney, Agent, or Firm* — Treyz Law Group, P.C.; Kendall P. Woodruff

(57) ABSTRACT

An electronic device may include a housing having first and second housing portions that rotate relative to one another about a bend axis. A flexible display may have first and second display regions overlapping the first and second housing portions. The flexible display may be overlapped by a cover layer. A heating element such as a conductive layer may be used to ohmically heat the cover layer, thereby smoothing wrinkles and reducing the modulus of elasticity of polymer layers within the cover layer. The heating element may be controlled based on temperature data from a temperature sensor, strain data from a strain gauge, and/or other information. If desired, movement of the first housing portion relative to the second housing portion may be restricted (e.g., a hinge may be locked) when the temperature of the cover layer falls below a given threshold.

19 Claims, 11 Drawing Sheets

FLEXIBLE DISPLAYS WITH HEATING ELEMENTS

FIELD

This relates generally to electronic devices and, more particularly, to electronic devices with flexible displays.

BACKGROUND

Electronic devices such as laptop computers, cellular telephones, and other equipment may include displays. To enhance portability, devices and displays may be provided with the ability to fold. A foldable display may be placed in an unfolded configuration to expand the size of the display and thereby facilitate user interaction with the display. When it is desired to enhance portability, the foldable display may be placed in a folded configuration.

A flexible display in a foldable device is sometimes provided with a thin cover layer to protect the display while also permitting the display to bend as the device is folded. Some of the layers in the cover layer and/or display may have a modulus of elasticity that is temperature dependent, causing the display to become stiffer in cooler temperatures. If care is not taken, damage can be caused to the cover layer or underlying display layers if the device is folded or unfolded at sufficiently low temperatures.

SUMMARY

An electronic device may have a hinge that allows the device to be flexed about a bend axis. The electronic device may include a housing having first and second housing portions that rotate relative to one another about the bend axis. A flexible display may have first and second display regions overlapping the first and second housing portions and the bend axis. The flexible display may be overlapped by a cover layer having one or more glass layers and one or more polymer layers.

A heating element such as a conductive layer may be located in the cover layer to ohmically heat the cover layer, thereby smoothing wrinkles and reducing the modulus of elasticity of the polymer layers within the cover layer to ensure that the device can be opened and closed without damaging the cover layer or underlying display layers. The heating element may be controlled based on temperature data from a temperature sensor, strain data from a strain gauge, optical sensor data from an optical sensor, weather data, location data, and/or other information.

If desired, movement of the first housing portion relative to the second housing portion may be restricted (e.g., a hinge may be locked) when the temperature of the cover layer falls below a given threshold. The hinge may be unlocked when the temperature of the cover layer rises above the given threshold to allow the device to be freely opened and closed.

DETAILED DESCRIPTION

Figure 1:
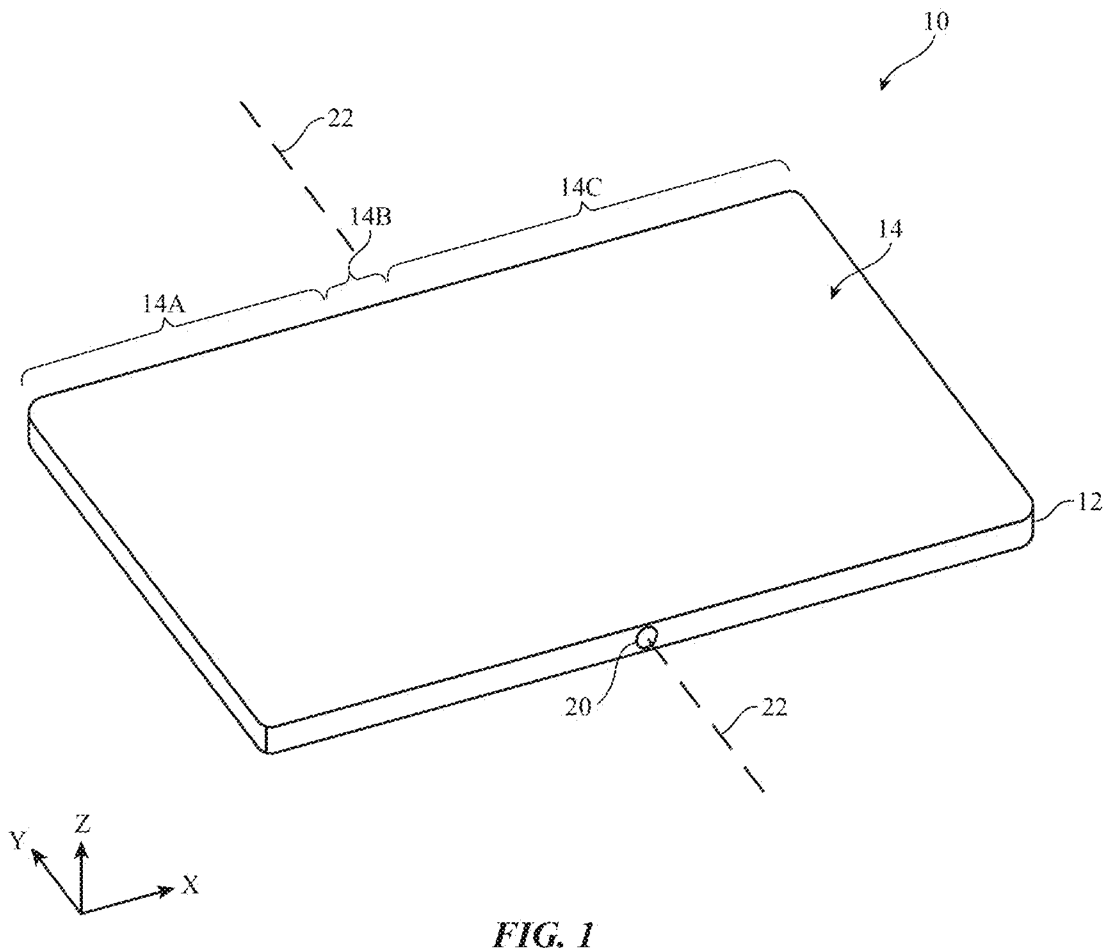
FIG. 1 is a perspective view of an illustrative electronic device having a foldable display in accordance with some embodiments.

An illustrative electronic device of the type that may be provided with a flexible display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a wearable or miniature device of other types, a computer display that does not contain an embedded computer, a computer display that includes an embedded computer, a gaming device, a navigation device, a head-mounted device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, watch or other wrist device, or other portable computing device. Other configurations may be used for device 10 if desired. The example of FIG. 1 is merely illustrative.

In the example of FIG. 1, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Housing 12 may have hinge structures such as hinge 20 to allow device 10 to bend about bend axis 22. Housing 12 may have first and second housing portions that rotate with respect to each other as device 10 is bent (folded) about bend axis 22 using hinge 20 or other flexible structures joining the first and second housing portions.

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures. A touch sensor may be formed using electrodes or other structures on a display layer that contains a pixel array or on a separate touch panel layer that is attached to the pixel array (e.g., using adhesive).

Display 14 may include pixels formed from liquid crystal display (LCD) components, electrophoretic pixels, microelectromechanical (MEMs) shutter pixels, electrowetting pixels, micro-light-emitting diodes (small crystalline semiconductor die), organic light-emitting diodes (e.g., pixels in a thin-film organic light-emitting diode display), or pixels based on other display technologies. Configurations in which display 14 has an array of light-emitting pixels such as an array of organic light-emitting diode pixels may sometimes be described herein as an example.

Display 14 may have a portion that overlaps bend axis 22. To facilitate bending of device 10 about axis 22, all of display 14 may be formed using flexible structures or at least the portion of display 10 that overlaps bend axis 22 may be formed using flexible structures. A display cover layer or other layer may form the outermost surface of the display. Display layers such these (e.g., display cover layers) may be formed from glass, plastic, and/or other transparent display cover layer structures and may be flexible (at least where these layers overlap bend axis 22 of device 10).

As shown in FIG. 1, for example, display 14 may have three portions such as portions 14A, 14B, and 14C. In portions 14A and 14C, display 14 may be flexible or may be rigid (e.g., the pixel array in these areas may be rigid and/or the display cover layer structures in these regions may be rigid). Flexible portion 14B (sometimes referred to as bendable region 14B) overlaps bend axis 22 and forms a strip that lies between portions 14A and 14C and that extends across the width of the display between opposing edges of the display. To ensure that flexible portion 14B is sufficiently flexible to allow device 10 to bend about axis 22, display layers such as a display cover layer for display 14 may be formed from one or more thin flexible glass and/or polymer layers that accommodate bending of display 14 about axis 22 and underlying display layers (e.g., a polymer substrate, metal traces, a polarizer layer, a touch sensor layer, adhesive layers, and other conducting and dielectric layers in an organic light-emitting diode pixel array) may also be formed from flexible materials and structures.

Figure 2:
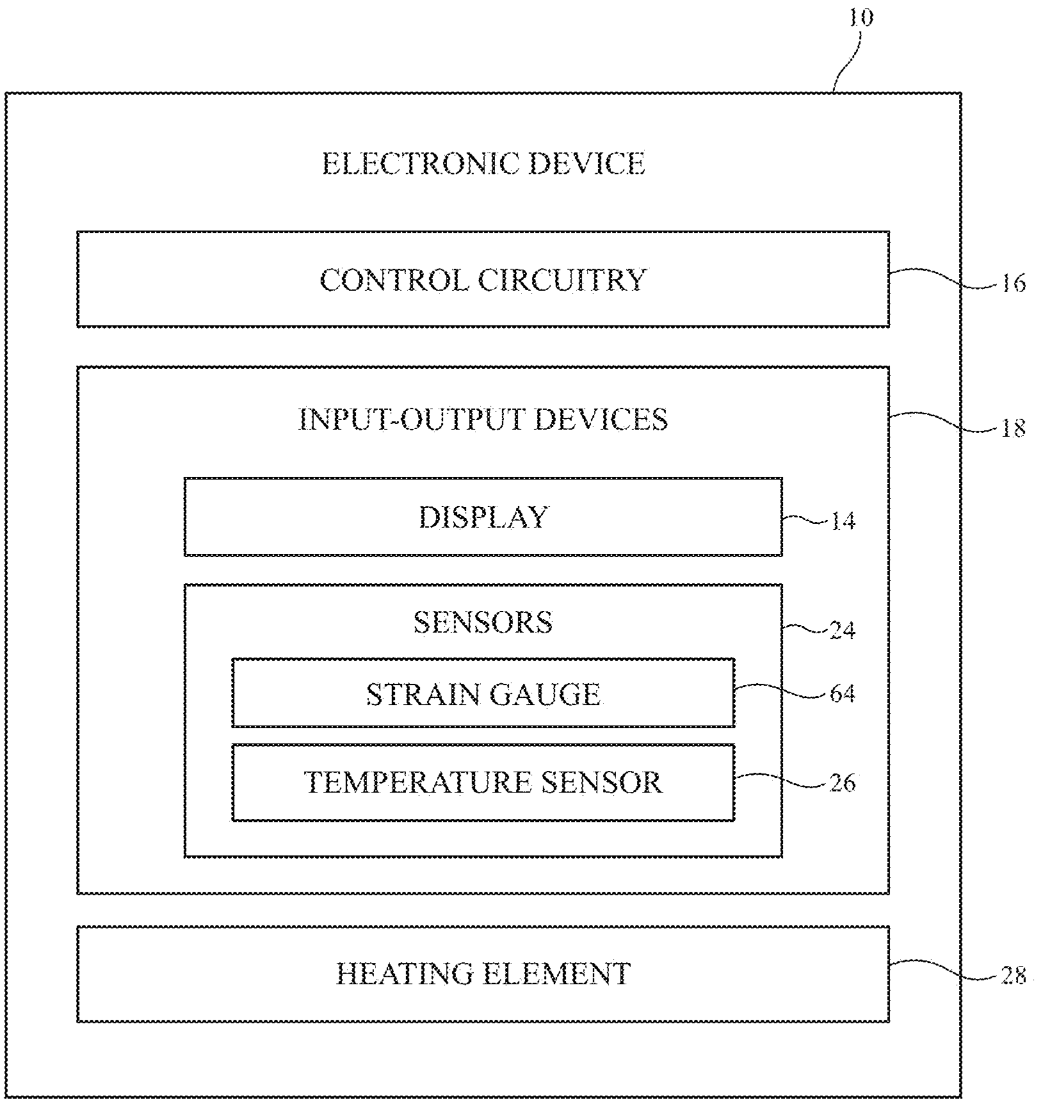
FIG. 2 is a schematic diagram of an illustrative electronic device having a foldable display in accordance with some embodiments.

A schematic diagram of an illustrative electronic device such as device 10 of FIG. 1 is shown in FIG. 2. As shown in FIG. 2, electronic device 10 may have control circuitry 16 (sometimes referred to as controller 16). Control circuitry 16 may include storage and processing circuitry for supporting the operation of device 10. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid-state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Control circuitry 16 may include wired and/or wireless communications circuitry. The wireless communications circuitry of control circuitry 16 may include one or more antennas and one or more radio-frequency transceiver circuits (e.g., a cellular telephone transceiver, a wireless local area network transceiver, etc.).

Device 10 may include input-output devices 18, which may allow data to be supplied to device 10 and to allow data to be provided from device 10 to external devices. Input-output devices 18 may include buttons, joysticks, scrolling wheels, keypads, keyboards, tone generators, haptic output devices such as vibrators, light-emitting diodes and other status indicators, data ports, etc. Input-output devices 18 may also include one or more displays, such as display 14, and one or more sensors, such as sensors 24. Devices 18 may also include light-emitting diodes (e.g., status indicator lights, a camera flash, etc.) and/or other light-emitting devices. Light-based (optical) components such as these (e.g., light-emitting device and/or light-based sensors) may be mounted under transparent window regions (e.g., a transparent window in a portion of display 14, a transparent window in a device housing, etc.).

Display 14 may be a touch screen display that includes a touch sensor for gathering touch input from a user, or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. Display 14 may be a liquid crystal display (LCD), organic light-emitting diode (OLED) display, microLED display, or a display based on any other suitable display technology.

In some embodiments, display 14 may be a flexible display. For example, display 14 may be bendable along a bend axis to move display 14 between an open (e.g., unfolded or partially folded) state and a closed (e.g., folded) state.

Sensors 24 may include touch sensors (e.g., capacitive touch sensors formed from arrays of capacitive touch sensor electrodes that overlap display 14 and/or that are formed elsewhere in device 10), microphones for gathering ambient noise measurements and voice commands, a magnetic sensor (e.g., a compass), an accelerometer, a gyroscope, a force sensor (e.g., a two-dimensional force sensor which may optionally overlap a touch sensor and/or display 14), a temperature sensor, a pressure sensor, a compass, etc. Sensors 24 may also include light-based sensors such as a light-based proximity sensor (e.g., an optical proximity sensor having an infrared light-emitting diode that emits light and having a corresponding infrared light detector for measuring the infrared light after the infrared light has reflected from an external object), an ambient light sensor (e.g., a color-sensitive ambient light sensor that can measure ambient light color and intensity), and a camera (e.g., a digital image sensor) for capturing images, and/or other image sensing and/or light-detecting devices.

Sensors 24 may also include sensors for measuring display characteristics such as strain and temperature. For example, sensors 24 may include one or more strain gauges such as strain gauge 64 for measuring strain on display 14 (e.g., within bend region 14B of display 14). Sensors 24 may also include one or more temperature sensors such as temperature sensor 26. Temperature sensor 26 may be configured to measure ambient temperature and/or may be configured to measure temperature within display 14 (e.g., within a cover layer overlapping display 14).

Figure 3:
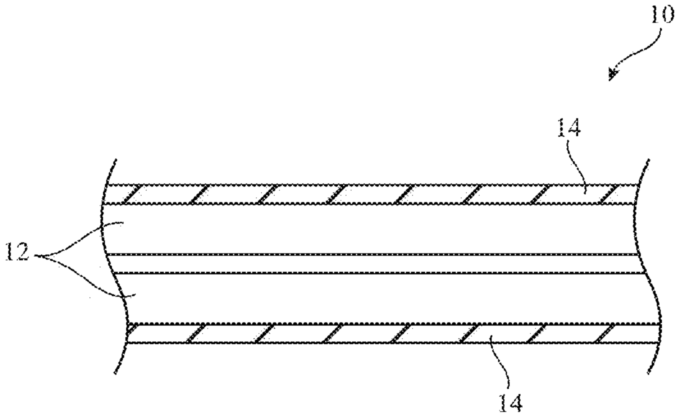
FIG. 3 is a cross-sectional side view of an illustrative electronic device with a foldable display in a back-to-back folded configuration in accordance with some embodiments.
Figure 4:
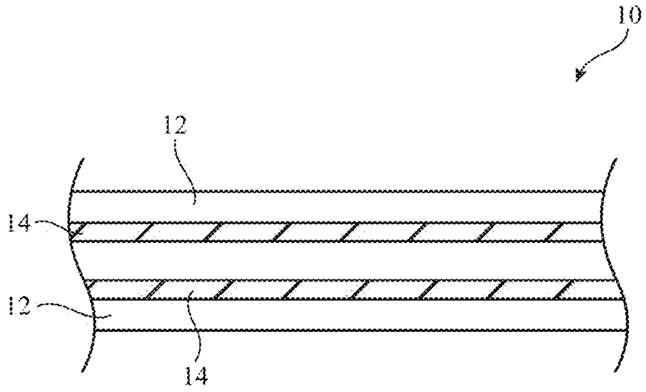
FIG. 4 is a cross-sectional side view of an illustrative electronic device with a foldable display in a face-to-face folded configuration in accordance with some embodiments.

As shown in FIG. 3, device 10 may be folded (bent by 180° or other suitable amount) about bend axis 22 so that display 14 is visible from the outside of device 10 in its folded state. FIG. 4 shows how device 10 may be folded about bend axis 22 so that display 14 is protected within the interior of device 10. Device 10 may have flexible structures (e.g., a hinge) to allow outward bending of the type shown in FIG. 3, to allow inward bending of the type shown in FIG. 4, or to allow bending of both the type shown in FIG. 3 and the type shown in FIG. 4. Configurations in which device 10 is flexed by different amounts (e.g., more than 180° or less than 180°) may also be used.

Figure 5:
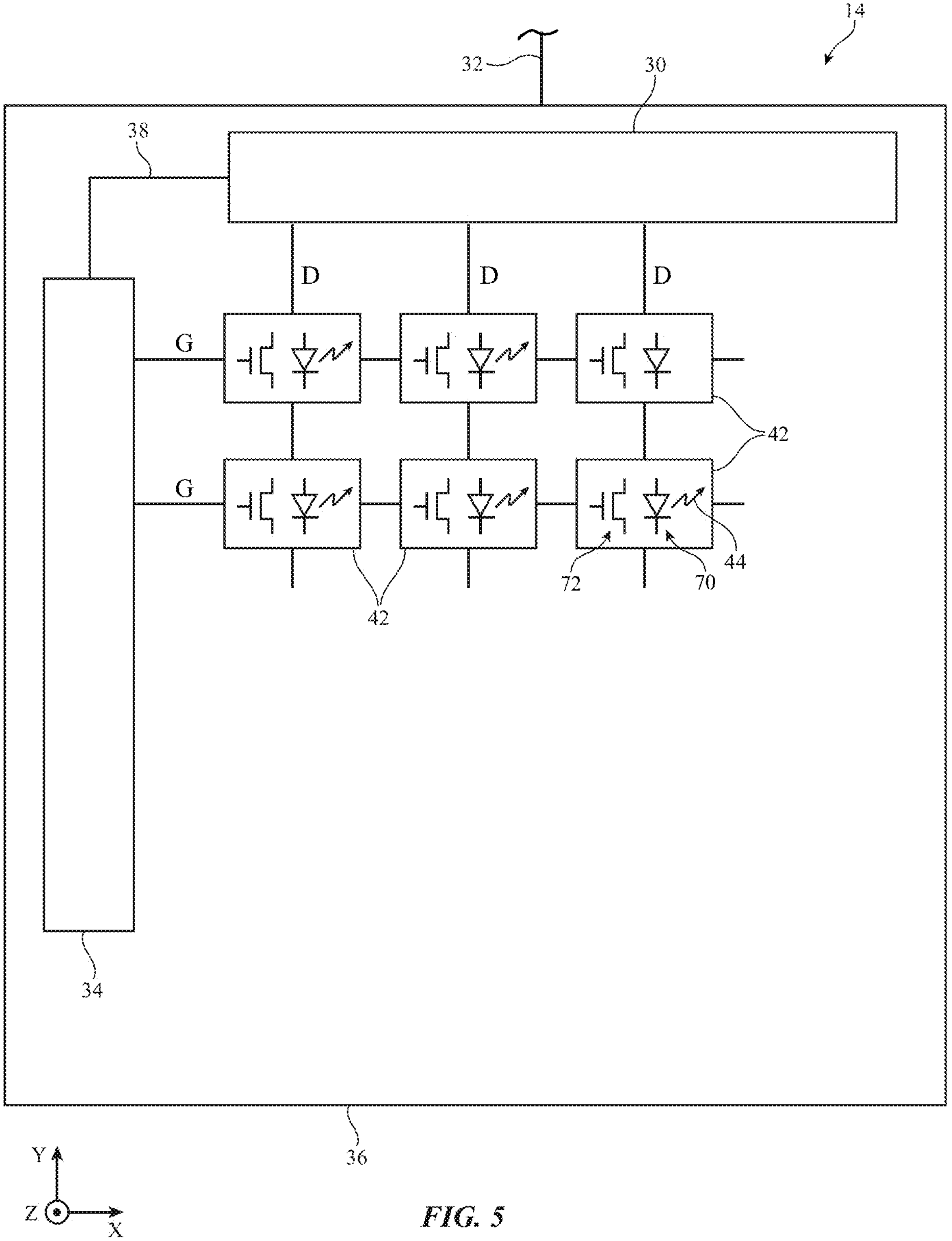
FIG. 5 is a diagram of an illustrative display with an array of pixels in accordance with some embodiments.

Display 14 may have a rectangular shape (i.e., display 14 may have a rectangular footprint and a rectangular peripheral edge that runs around the rectangular footprint) or may have other suitable shapes. A top view of circuitry in an illustrative display with a rectangular shape is shown in FIG. 5. As shown in FIG. 5, display 14 may have an array of pixels 42 formed on substrate 36. Substrate 36 may be formed from glass, metal, plastic, ceramic, or other substrate materials. Pixels 42 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 42 in display 14 (e.g., tens or more, hundreds or more, or thousands or more). Each pixel 42 may have a light-emitting diode 70 that emits light 44 under the control of a pixel circuit formed from thin-film transistor circuitry such as thin-film transistors 72 and thin-film capacitors). Thin-film transistors 72 may be polysilicon thin-film transistors, semiconducting-oxide thin-film transistors such as indium gallium zinc oxide transistors, or thin-film transistors formed from other semiconductors. Pixels 42 may contain light-emitting diodes of different colors (e.g., red, green, and blue diodes for red, green, and blue pixels, respectively) to provide display 14 with the ability to display color images.

Display driver circuitry may be used to control the operation of pixels 42. The display driver circuitry may be formed from integrated circuits, thin-film transistor circuits, or other suitable circuitry. Display driver circuitry 30 of FIG. 2 may contain communications circuitry for communicating with system control circuitry such as control circuitry 50 of FIG. 2 over path 32. Path 32 may be formed from traces on a flexible printed circuit or other cable. During operation, the control circuitry (e.g., control circuitry 50 of FIG. 2) may supply circuitry 30 with information on images to be displayed on display 14.

To display the images on pixels 42, display driver circuitry 30 may supply image data to data lines D while issuing clock signals and other control signals to supporting display driver circuitry such as gate driver circuitry 34 over path 38. If desired, circuitry 30 may also supply clock signals and other control signals to gate driver circuitry on an opposing edge of display 14 or may use display driver circuitry with other layouts. The configuration of FIG. 5 is illustrative.

Gate driver circuitry 34 (sometimes referred to as horizontal control line control circuitry) may be implemented as part of an integrated circuit and/or may be implemented using thin-film transistor circuitry. Gate lines G (sometimes referred to as horizontal control lines) in display 14 may carry gate line signals (sometimes referred to as scan line signals, emission enable control signals, etc.) for controlling the pixels of each row. There may be any suitable number of control signals per row of pixels 22 (e.g., one or more, two or more, three or more, four or more, etc.).

Figure 6:
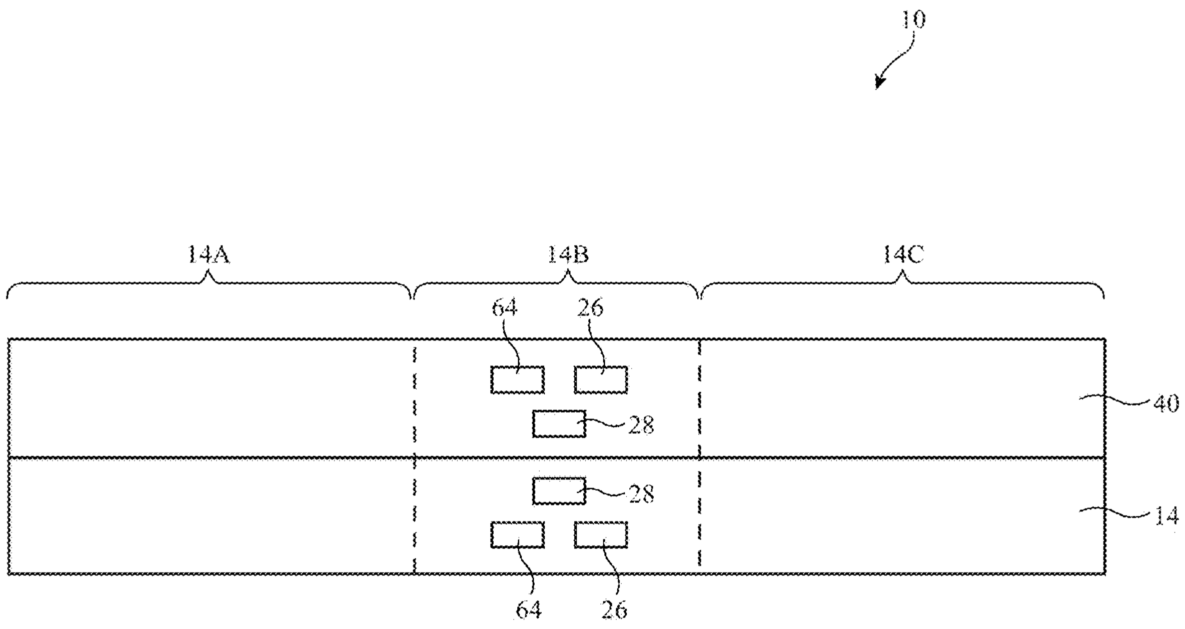
FIG. 6 is a side view of an illustrative electronic device having a foldable display with one or more strain gauges, one or more temperature sensors, and/or one or more heating elements in accordance with some embodiments.

FIG. 6 is a side view of an illustrative electronic device with a flexible display. FIG. 6 shows flexible display 14 with portions 14A and 14C that may be rigid or flexible as well as flexible portion 14B. As shown in FIG. 6, display 14 is overlapped by a display cover layer 24.

Display cover layer 24 may be a transparent layer formed from glass, polymer, sapphire, and/or any other desired material. The display cover layer may have a high transparency (e.g., greater than 80%, greater than 90%, greater than 95%, greater than 99%, etc.). Display cover layer 24 may have a thickness that is less than 200 microns, less than 100 microns, less than 50 microns, less than 30 microns, greater than 10 microns, greater than 20 microns, greater than 50 microns, between 20 microns and 90 microns, between 10 microns and 200 microns, etc.

As shown in FIG. 6, display 14 and/or cover layer 40 may include one or more sensors for monitoring strain such as strain gauge 64 and/or one or more sensors for measuring temperature such as temperature sensor 26. Display 14 and/or cover layer 40 may also or alternatively include one or more heating elements such as heating element 28. Strain gauge 64 (sometimes referred to as a strain gauge sensor, a resistive sensor, etc.) may be a Wheatstone bridge with terminals and meandering traces. When display 14 is bent, the resistance of the traces in strain gauge 64 may change. Control circuitry 16 may be configured to measure the changes in resistance of strain gauge 64 to determine the strain on the strain gauge (and therefore the corresponding strain in cover layer 40 and/or display 14). If desired, strain gauge 64 may only be located in bend region 14B of display 14 and/or bend region 14B of cover layer 40, or strain gauge 64 may be located in portions 14A and/or 14C of display 14 and/or cover layer 40.

Temperature sensor 26 may be configured to measure the temperature of cover layer 40 and/or display 14. Temperature sensor 26 may include temperature coefficient thermistors, resistance temperature detectors, thermocouples, semiconductor based sensors, and/or any other suitable temperature sensor.

Heating element 28 may include one or more resistive heating layers (sometimes referred to as Ohmic heating layers, conductive layers, etc.), Peltier heating elements, and/or other heating layers that can be heated to smooth wrinkles and/or to reduce the modulus of elasticity in display cover layer 40 and/or display 14. Heating element 28 may be controlled by control circuitry 16. If desired, heating element 28 may be adjusted based on sensor data from temperature sensor 26 (e.g., heating element 28 may be activated when temperature sensor 26 detects temperatures below a given threshold), based on sensor data from strain gauge 64 (e.g., heating element 28 may be activated when strain gauge 64 detects wrinkles in cover layer 40 and/or display 14), based on other data (e.g., heating element 28 may be activated when an optical sensor detects wrinkles in cover layer 40 and/or display 14), based on location data and/or weather data (e.g., heating element 28 may be activated when location data and/or weather data indicates that device 10 is in a cold environment), and/or based on other data. In some arrangements, heating element 28 may be activated automatically to warm up display 14 and/or cover layer 40 for a predetermined period of time before and/or after device 10 is opened.

In addition to or instead of using heating element 28 to heat up display 14 and/or cover layer 40, control circuitry 16 may take other actions to protect display 14. For example, when temperature sensor 26 detects temperatures below a given threshold (and/or when weather data and/or location data indicates that device 10 is in a cold environment), control circuitry 16 may restrict movement of display region 14A relative to display region 14C. For example, control circuitry 16 may deploy a latch, may lock a hinge, may deploy a stop structure, may increase the force required to open and/or close device 10, and/or may take other suitable actions to restrict movement of display region 14A relative to display region 14C to avoid damaging display 14 and/or cover layer 40 in low temperatures. When temperature sensor 26 indicates that the temperature of display 14 and/or cover layer 40 has returned to room temperature (and/or other suitable temperature above a given threshold), control circuitry 16 may release the latch, unlock the hinge, retract the stop structure, and/or take other suitable actions to allow device 10 to be freely opened and closed.

Figure 7:
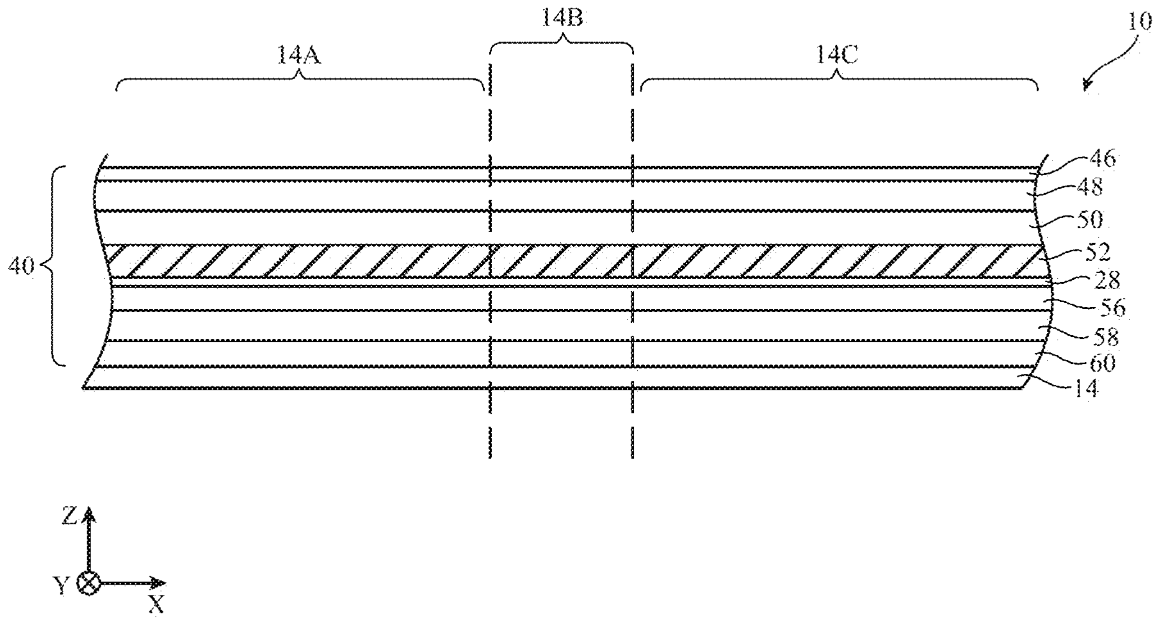
FIG. 7 is a side view of an illustrative electronic device having a foldable display with a heating element on a glass layer within a display cover layer in accordance with some embodiments.

FIG. 7 is a side view of electronic device 10 showing how a heating element may be incorporated into cover layer 40. As shown in FIG. 7, cover layer 40 may be made up of multiple layers such as polymer layers 48 and 58 (e.g., polyethylene terephthalate and/or other suitable polymers), adhesive layers 50, 56, and 60 (e.g., optically clear adhesive and/or any other suitable adhesive), hard coat layer 46, and one or more glass layers such as glass layer 52. Glass layer 52 may have a thickness of 30 microns to 40 microns, 20 microns to 35 microns, more than 40 microns, less than 40 microns, or other suitable thickness.

As shown in FIG. 7, heating element 28 may be formed on glass layer 52. Heating element 28 may include a conductive layer that is used to carry current to heat cover layer 40. Heating element 28 (sometimes referred to as conductive layer 28, heating layer 28, etc.) may be formed from an array of conductive lines arranged in a grid (e.g., a metal mesh), may be formed from conductive lines arranged in any other suitable pattern, or may be formed from a blanket layer of conductive material. Conductive layer 28 may be formed from transparent conductive materials (e.g., indium tin oxide or other transparent conductive oxide), carbon nanowires or nanotubes, silver nanowires, or other conductive layers (metal, transparent conductive material, a 2-5 nm film of silver, etc.).

When it is desired to heat cover layer 40 (e.g., based on strain data from strain gauge 64, temperature data from temperature sensor 26, optical sensor data from an optical sensor, weather data, location data, and/or other information), control circuitry 16 may apply an ohmic heating current to conductive layer 28. The ohmic heating current will ohmically heat conductive layer 28 and thereby heat cover layer 40. Heating cover layer 40 may reduce the modulus of elasticity of the polymer layers within cover layer 40 (e.g., polymer layers 48 and 58, adhesive layers 50, 56, and 60, etc.). This in turn helps smooth any wrinkles in cover layer 40 while also increasing the sheering ability of the polymer layers within cover layer 40 so that device 10 can be opened and closed freely without applying excessive strain to cover layer 40 and/or display 14.

Figure 8:
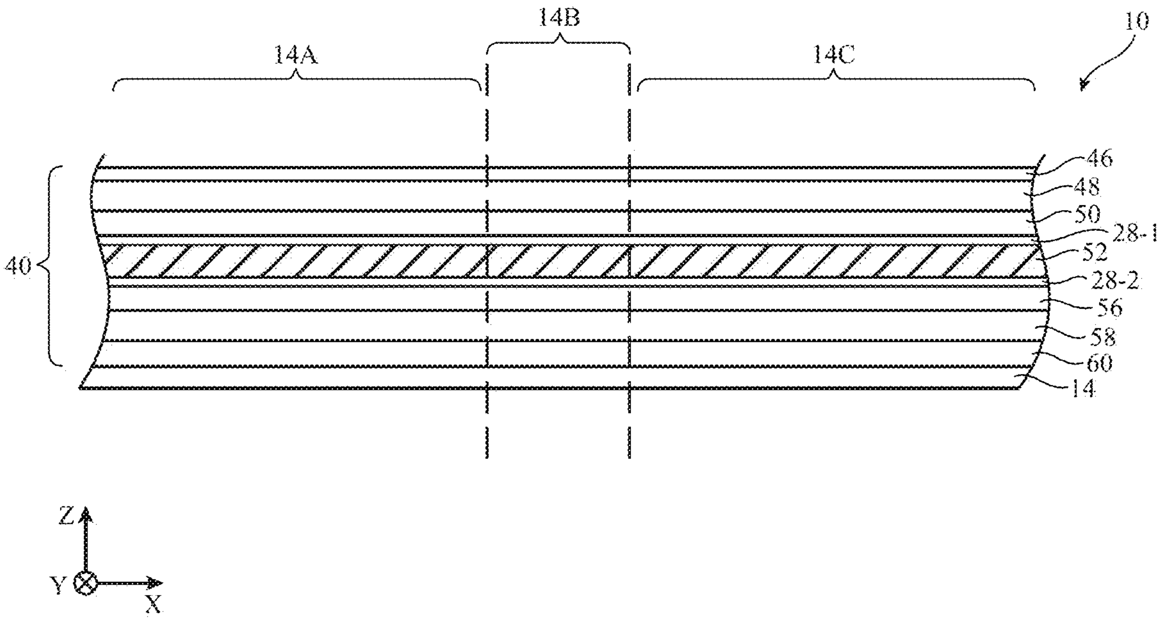
FIG. 8 is a side view of an illustrative electronic device having a foldable display with heating elements on opposing sides of a glass layer within a display cover layer in accordance with some embodiments.

In the example of FIG. 8, multiple heating layers have been incorporated into cover layer 40. For example, a first heating element such as conductive layer 28-1 may be formed on a first surface of glass layer 52, and a second heat element such as conductive layer 28-2 may be formed on a second opposing surface of glass layer 52. When it is desired to heat cover layer 40 (e.g., based on strain data from strain gauge 64, temperature data from temperature sensor 26, optical sensor data from an optical sensor, weather data, location data, and/or other information), control circuitry 16 may apply an ohmic heating current to conductive layer 28-1 and/or conductive layer 28-2. The ohmic heating current will ohmically heat conductive layers 28-1 and 28-2 and thereby heat cover layer 40. Heating cover layer 40 may reduce the modulus of elasticity of the polymer layers within cover layer 40 (e.g., polymer layers 48 and 58, adhesive layers 50, 56, and 60, etc.). This in turn helps smooth any wrinkles in cover layer 40 while also increasing the sheering ability of the polymer layers within cover layer 40 so that device 10 can be opened and closed freely without applying excessive strain to cover layer 40 and/or display 14.

Figure 9:
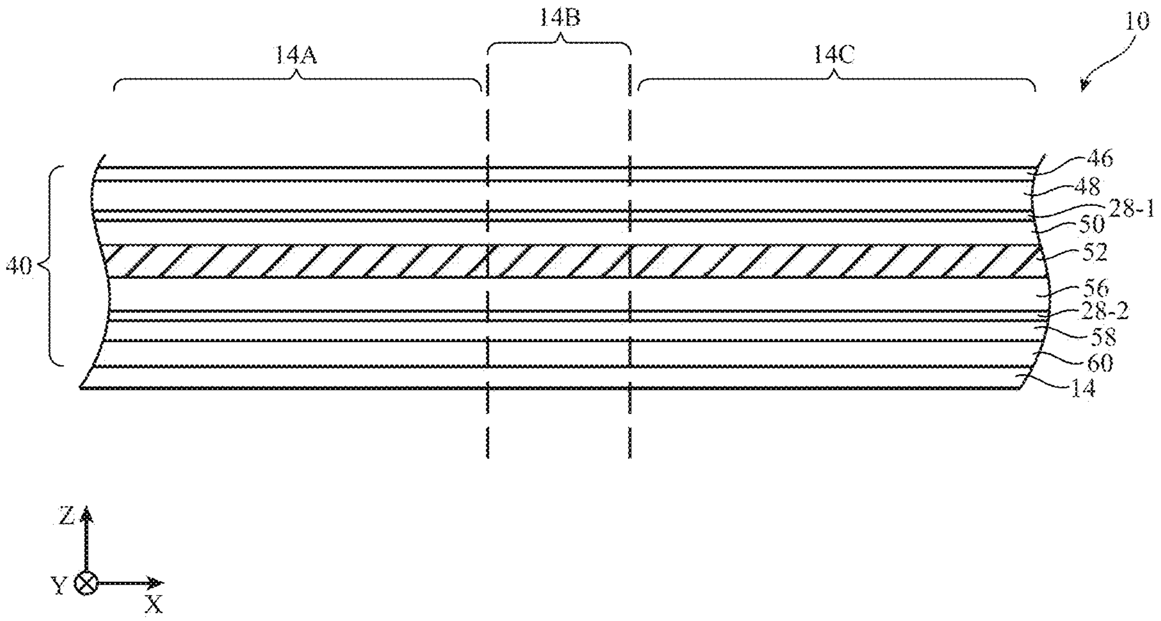
FIG. 9 is a side view of an illustrative electronic device having a foldable display with one or more heating elements on polymer layers within a display cover layer in accordance with some embodiments.

In the example of FIG. 9, heating elements 28 have been incorporated into other locations within display cover layer 40. For example, a first heating element 28-1 may be interposed between polymer layer 48 and adhesive layer 50, and a second heating element 28-2 may be interposed between adhesive layer 56 and polymer layer 58. If desired, one or more additional heating elements may be formed on one or both surfaces of glass layer 52.

When it is desired to heat cover layer 40 (e.g., based on strain data from strain gauge 64, temperature data from temperature sensor 26, optical sensor data from an optical sensor, weather data, location data, and/or other information), control circuitry 16 may apply an ohmic heating current to conductive layer 28-1 and/or conductive layer 28-2. The ohmic heating current will ohmically heat conductive layers 28-1 and 28-2 and thereby heat cover layer 40. Heating cover layer 40 may reduce the modulus of elasticity of the polymer layers within cover layer 40 (e.g., polymer layers 48 and 58, adhesive layers 50, 56, and 60, etc.). This in turn helps smooth any wrinkles in cover layer 40 while also increasing the sheering ability of the polymer layers within cover layer 40 so that device 10 can be opened and closed freely without applying excessive strain to cover layer 40 and/or display 14.

Figure 10:
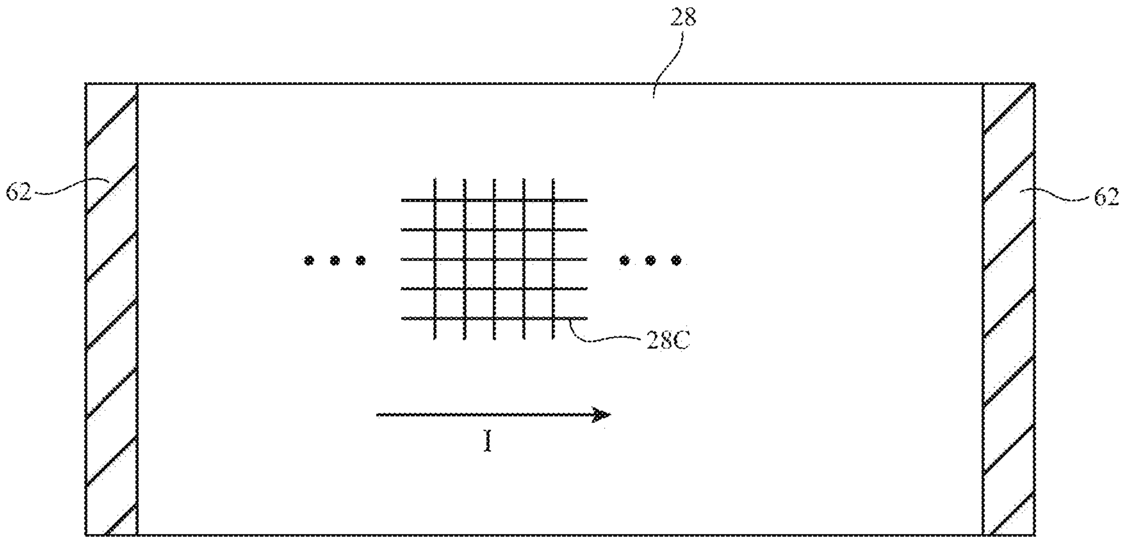
FIG. 10 is a top view of an illustrative resistive heating layer that may be incorporated into a display cover layer in accordance with some embodiments.

FIG. 10 is a top view of conductive layer 28. In the example of FIG. 10, conductive layer 28 includes conductive mesh 28C (e.g., a grid of metal lines, an array of carbon nanowires, etc.). The metallic lines that make up conductive mesh 28C may be transparent and/or may be nano-scale wires so that the wires are not visible to the eye. If desired, conductive mesh 28C may have a pitch that is smaller than the wavelength of visible light so that conductive mesh 28C is transparent. Conductive layer 28 may be provided with one or more terminals such as terminals 62. Control circuitry in device 10 may apply signals to terminals 62 when it is desired to ohmically heat cover layer 40 and/or display 14 (e.g., based on strain data from strain gauge 64, temperature data from temperature sensor 26, optical sensor data from an optical sensor, weather data, location data, and/or other information). Terminals 62, which may sometimes be referred to as busbars or contacts, may be shorted to one or more conductive layers in layer 28 such as conductive mesh 28C. In the example of FIG. 10, current I is flowing across layer 28 to ohmically heat cover layer 40 and/or display 14. If desired, current I may flow in other directions.

Terminals 62 (sometimes referred to as contacts 62) may have elongated shapes as shown in the FIG. 10 example (e.g., terminals 62 may be formed from strips of metal that run along the edges of layer 28, etc.) or may have other suitable shapes. If desired, terminals 62 may be hidden from view by an opaque masking layer (e.g., black ink) that extends around the perimeter of display 14 and/or cover layer 40.

Figure 11:
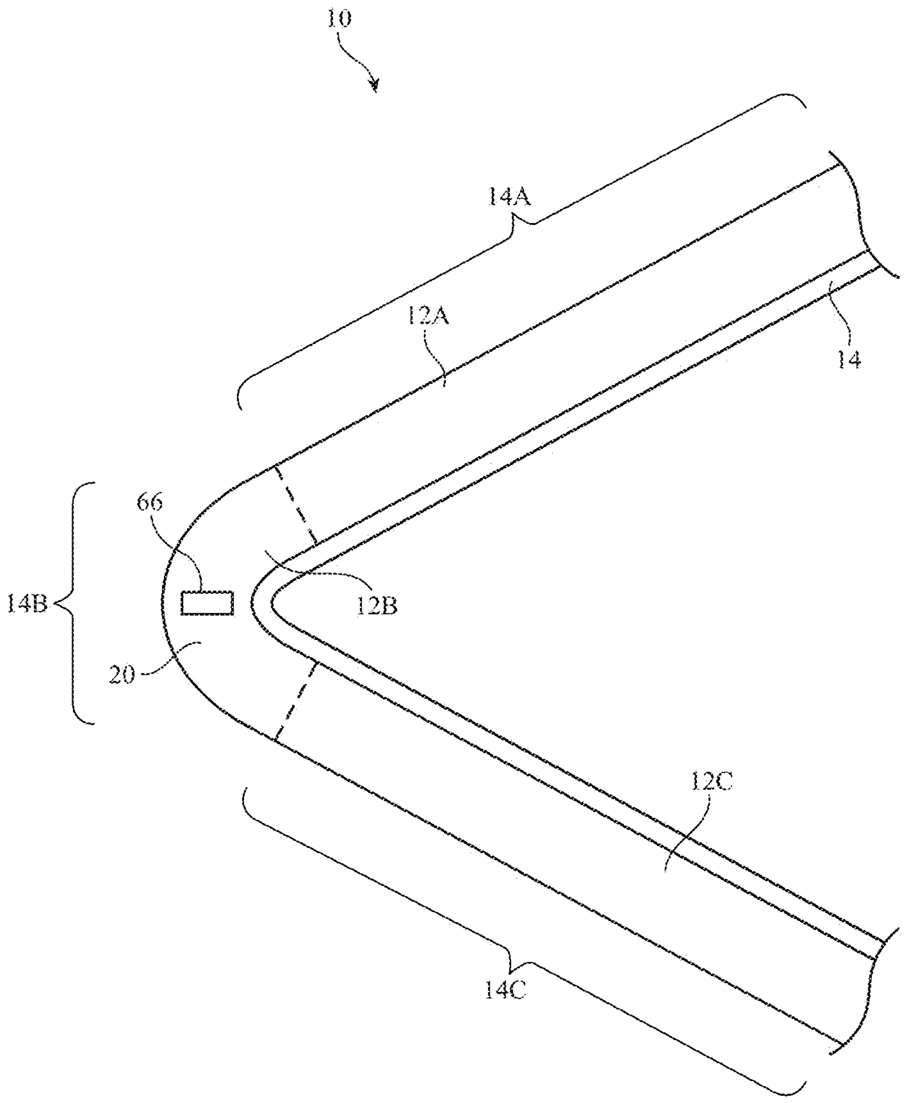
FIG. 11 is a side view of an illustrative electronic device having a foldable display and having an actuator configured to restrict movement of the foldable display in accordance with some embodiments.

FIG. 11 is a side view of device 10 showing how movement of device 10 may be restricted in cooler temperatures, when strain is detected, and/or when other conditions are present that might cause damage to display 14 if display 14 is opened or closed too quickly. As shown in FIG. 11, housing 12 may include hinge 20 in housing portion 12B coupled between first and second housing portions 12A and 12C. Display 14 may include first and second display regions 14A and 14C respectively overlapping first and second housing portions 12A and 12C. Bendable region 14B of display 14 may overlap hinge 20 and housing portion 12B.

Hinge 20 may be a locking hinge configured to lock and unlock in one or more different positions. If desired, locking of hinge 20 may be controlled by actuator 66. Actuator 66 may be configured to restrict motion of housing portion 12A relative to housing portion 12C. Actuator 66 may be a pneumatic actuator, a mechanical actuator, an electric actuator, a piezoelectric actuator, a rotary actuator, and/or any other suitable actuator for adjusting the operation of hinge 20. For example, actuator 66 may be configured to deploy a pin, tighten a screw, and/or take other actions to lock hinge 20 in place (e.g., to lock hinge 20 in a fully open or partially open configuration) to prevent and/or restrict movement of housing portion 12A (and display region 14A) relative to housing portion 12C (and display region 14C).

In some arrangements, actuator 66 may restrict movement of housing portion 12A relative to housing portion 12C in response to sensor data. For example, actuator 66 may restrict movement of housing portion 12A relative to housing portion 12C when temperature sensor 26 indicates that the temperature of cover layer 40, the temperature of display 14, and/or the ambient temperature is below a given threshold. Actuator 66 may restrict movement of housing portion 12A relative to housing portion 12C when strain gauge 64 detects strain levels above a given threshold and/or when an optical sensor detects visible wrinkles in display 14 and/or cover 40. In some arrangements, weather data and/or location data may be used to determine when device 10 is in cooler temperatures and that movement of housing 12 should be restricted to avoid display damage. When sensor data (e.g., temperature data, strain data, optical data indicative of wrinkles, etc.) indicates that display 14 is no longer at risk (e.g., due to warmer temperatures, lack of wrinkles, etc.), actuator 66 may unlock hinge 20 and device 10 may be freely opened and closed.

Figure 12:
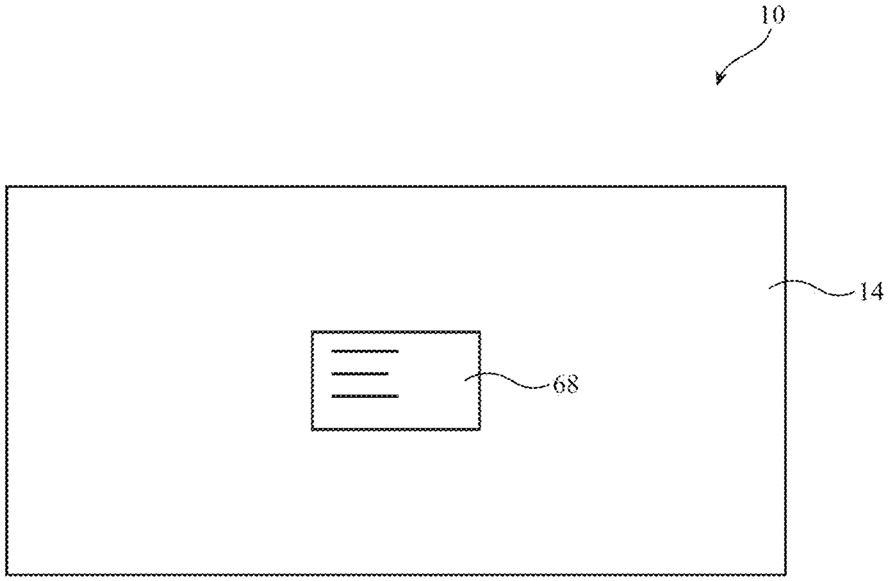
FIG. 12 is a perspective view of an illustrative electronic device having a foldable display configured to display a message in accordance with some embodiments.

FIG. 12 is a perspective view of device 10 showing how display 14 may be used to display a warning or message based on sensor data from temperature sensor 26, strain data from strain gauge 64, optical sensor data indicative of wrinkles, weather data, location data, and/or other information. As shown in FIG. 12, display 14 may display image 68 in response to sensor data indicating that display 14 and/or cover layer 40 is too cold and/or is under excessive strain. Image 68 may be a message instructing the user to avoid opening or closing device 10, may be a temperature gauge that informs the user of the display's current temperature and that indicates when the display has warmed up sufficiently to be opened or closed, may be a symbol or status indicator, and/or may be any other suitable image. When sensor data indicates that movement of housing 12A relative to housing 12C is likely to cause damage to display 14, control circuitry 16 may use display 14 to display image 68 to alert the user that device 10 should not be opened or closed, that device 10 should be opened or closed slowly, and/or that other actions should be taken (e.g., that device 10 should be moved to a warmer environment). When sensor data indicates that movement of housing 12A relative to housing 12C is no longer likely to cause damage to display 14, control circuitry 16 may remove image 68 or may adjust image 68 to let the user know that temperatures are sufficiently warm and/or that device 10 can safely be opened or closed.

The foregoing is merely illustrative and various modifications can be made to the described embodiments. The foregoing embodiments may be implemented individually or in any combination.

What is claimed is:

1. An electronic device, comprising:

a foldable housing having first and second housing portions configured to rotate relative to one another about a fold axis;

a flexible display having first and second display regions that respectively overlap the first and second housing portions and having a bendable region overlapping the fold axis;

a display cover layer overlapping the first and second display regions and the bendable region; and a heating element configured to heat the display cover layer based on a measured temperature, wherein the heating element is interposed between the display cover layer and the flexible display.

2. The electronic device defined in claim 1 further comprising a temperature sensor configured to measure the temperature.

3. The electronic device defined in claim 1 wherein the heating element comprises a conductive layer in the display cover layer that is configured to convey ohmic heating current.

4. The electronic device defined in claim 3 wherein the display cover layer comprises a glass layer and wherein the conductive layer is formed on the glass layer.

5. The electronic device defined in claim 4 wherein the conductive layer comprises silver.

6. The electronic device defined in claim 3 wherein the display cover layer comprises a polymer layer and wherein the conductive layer is formed on the polymer layer.

7. The electronic device defined in claim 1 wherein movement of the first housing portion relative to the second housing portion is restricted when the measured temperature falls below a given threshold.

8. The electronic device defined in claim 7 wherein the foldable housing comprises a hinge coupled between the first and second housing portions and wherein the hinge is configured to lock when the measured temperature falls below the given threshold.

9. The electronic device defined in claim 8 wherein the hinge is configured to unlock when the measured temperature rises above the given threshold.

10. The electronic device defined in claim 1 wherein the flexible display is configured to display a message based on the measured temperature.

11. An electronic device, comprising:

a housing having first and second housing portions configured to rotate relative to one another about a fold axis;

a flexible display having first and second display regions that respectively overlap the first and second housing portions and having a bendable region overlapping the fold axis;

a display cover layer overlapping the first and second display regions and the bendable region; and a temperature sensor configured to measure temperature, wherein movement of the first housing portion relative to the second housing portion is restricted in response to measuring a temperature below a given threshold with the temperature sensor, wherein the housing comprises a hinge coupled between the first and second housing portions, and wherein the hinge is configured to lock in response to measuring the temperature below the given threshold with the temperature sensor.

12. The electronic device defined in claim 11 further comprising a conductive layer configured to ohmically heat the display cover layer in response to measuring the temperature below the given threshold with the temperature sensor.

13. The electronic device defined in claim 12 wherein the hinge is configured to unlock in response to measuring that the temperature has risen above the given threshold with the temperature sensor.

14. The electronic device defined in claim 12 wherein the display cover layer comprises first and second polymer layers and a layer of glass interposed between the first and second polymer layers and wherein the conductive layer is formed on the layer of glass.

15. An electronic device, comprising:

a foldable housing having first and second housing portions coupled by a hinge;

a flexible display having first and second display regions that respectively overlap the first and second housing portions and having a bendable region overlapping the hinge;

a display cover layer overlapping the first and second display regions and the bendable region; and a heating element configured to heat the display cover layer in response to detecting a wrinkle in the display cover layer.

16. The electronic device defined in claim 15 further comprising a sensor configured to detect the wrinkle in the display cover layer.

17. The electronic device defined in claim 16 wherein the sensor is selected from the group consisting of: a strain gauge and an optical sensor.

18. The electronic device defined in claim 15 further comprising a temperature sensor configured to measure a temperature, wherein the heating element is controlled at least partly based on the measured temperature.

19. The electronic device defined in claim 15 wherein the heating element comprises a conductive layer configured to convey ohmic heating current.

* * * * *